United States Patent
Qu et al.

(10) Patent No.: US 10,771,089 B2
(45) Date of Patent: Sep. 8, 2020

(54) METHOD OF INPUT DATA COMPRESSION, ASSOCIATED COMPUTER PROGRAM PRODUCT, COMPUTER SYSTEM AND EXTRACTION METHOD

(71) Applicant: TOTAL SA, Courbevoie (FR)

(72) Inventors: Long Qu, Pau (FR); Marianne Cuif-Sjostrand, Pau (FR); Mathieu Zmudz, Pau (FR)

(73) Assignee: TOTAL SA, Courbevoie (FR)

( * ) Notice: Subject to any disclaimer, the term of this patent is extended or adjusted under 35 U.S.C. 154(b) by 0 days.

(21) Appl. No.: 16/390,084

(22) Filed: Apr. 22, 2019

(65) Prior Publication Data

US 2019/0326928 A1 Oct. 24, 2019

(30) Foreign Application Priority Data

Apr. 23, 2018 (EP) .................................. 18305499

(51) Int. Cl.
| | | |
|---|---|---|
| H03M 7/04 | (2006.01) | |
| H03M 7/30 | (2006.01) | |
| H03M 7/32 | (2006.01) | |
| H03M 7/40 | (2006.01) | |

(52) U.S. Cl.
CPC ......... H03M 7/3088 (2013.01); H03M 7/302 (2013.01); H03M 7/3017 (2013.01); H03M 7/40 (2013.01)

(58) Field of Classification Search
CPC .. H03M 7/3088; H03M 7/3017; H03M 7/302; H03M 7/40
USPC ...................................................... 341/50, 51
See application file for complete search history.

(56) References Cited

U.S. PATENT DOCUMENTS

| | | | | |
|---|---|---|---|---|
| 8,463,061 B2* | 6/2013 | Takada | ..................... | G06T 9/007 |
| | | | | 375/240.11 |
| 2002/0005862 A1* | 1/2002 | Deering | .................. | G06T 11/40 |
| | | | | 345/694 |
| 2018/0307980 A1* | 10/2018 | Barik | ................... | G06N 3/0445 |

FOREIGN PATENT DOCUMENTS

EP 0 486 165 A2 1/1992

OTHER PUBLICATIONS

European Search Report issued in corresponding European Patent Application No. EP 18 30 5499 dated Oct. 29, 2018.
(Continued)

*Primary Examiner* — Peguy Jean Pierre
(74) *Attorney, Agent, or Firm* — Troutman Pepper Hamilton Sanders LLP (57) ABSTRACT

A method of data compression performed by at least one core communicating with a central memory. The input data presents a two-dimensional input array formed by a plurality data items stored contiguously in the central memory according to a contiguous direction. The method comprises a step of wavelet transform comprising the following sub-steps: forming from the input array at least one tile comprising a plurality of consecutive data block columns, each data block column being formed by a plurality of lines of consecutive data items according to the contiguous direction, the length of each line being a multiple of the cache line length; and for each data block column computing dot products between a filter vector and each group of N lines using fused multiply-add instructions for the core.

13 Claims, 5 Drawing Sheets

(56) References Cited

OTHER PUBLICATIONS

Polikar, R., "The Wavelet Tutorial Part IV—Multiresolution Anaylsis: The Discrete Wavelet Transform" (1998), retrieved from the Internet on Oct. 29, 2018 https://ccrma.stanford.edu/-unjung/mylec/WTpart4.html (9 pages) cited in EPSR issued in 18 30 5499 dated Oct. 29, 2018.

Wikipedia "Multiply-accumulate operation" (Mar. 5, 2018), retrieved from the Internet on Oct. 29, 2018 https://en.wikipedia.org/w/index.php?title=Multiply%E2%93accumulate_operation&oldid=828936301 (4 pages) cited in EPSR issued in 18 30 5499 dated Oct. 29, 2018.

Cited in EPSR issued in 18 30 5499 dated Oct. 29, 2018WIKIPEDIA "FMA instruction set" (Apr. 16, 2018), retrieved from the Internet on Oct. 29, 2018 https://en.wikipedia.org/w/index.php?title=FMA_instruction_set&oldid=836764057 (6 pages) cited in EPSR issued in 18 30 5499 dated Oct. 29, 2018.

Internet Article "Topic: How to use the SSE 4.1 DPPS instruction (dot product packed single)" (Feb. 22, 2014), retrieved from the Internet on Oct. 29, 2018 https://nl.hideproxy.me/go.php?u=aidRUyd9ZhSKWv0seMAnEPbAsInh18ZZEexgb%2BN3gMY6K4Cj9daxyAQ&b=5&f=norefer, http://nasn32.com/board/index.php?topic=2956.0 (5 pages) cited in EPSR issued in 18 30 5499 dated Oct. 29, 2018.

Internet Article "Intel® Advanced Vector ExtensionsProgramming Reference", (Jun. 2011), retrieved from the Internet on Oct. 29, 2018 https://software.intel.com/sites/default/files/4f/5b/36945 (2 pages) cited in EPSR issued in 18 30 5499 dated Oct. 29, 2018.

\* cited by examiner

METHOD OF INPUT DATA COMPRESSION, ASSOCIATED COMPUTER PROGRAM PRODUCT, COMPUTER SYSTEM AND EXTRACTION METHOD

CROSS REFERENCE TO RELATED APPLICATION

This application claims priority of European Patent Application No. 18305499.8 filed Apr. 23, 2018. The entire contents of which are hereby incorporated by reference.

FIELD OF THE INVENTION

The present invention concerns a method of data compression.

The present invention concerns also associated computer program product, computer system and extraction method.

The invention is notably applicable in the field of High Performance Computer systems known as HPC systems, large scalable visualization systems, as well as work station used to process a large volume of data. Such data comprises for example information relative to a geological structure of the ground in a given zone or information relative to a seismic activity in such zone.

BACKGROUND OF THE INVENTION

The performances of modern HPC systems make it possible to process very large volumes of data.

As it is known in the art, such performances depend notably on the computing power which, according to the Moore's law, doubles approximately every 18 months. However, the computing power is not the only criterion defining the performances of an HPC system. Particularly, the speed rate of I/O processing (reading input data and writing output data) between operating processors and a file system should also be considered.

Indeed, comparing to the computing power growing, the speed rate of the I/O processing grows much slower. Hence, in the actual HPC systems, data processing is slowed down rather by the I/O processing than by the computing power.

To solve this issue, one of the technique proposed by the art consists to use data compression while I/O processing.

Particularly, according to this technique, data is compressed using existing compression routines so as overall I/O processing time can be considerably accelerated.

There are mainly two classes of data compression methods: lossless data compression and lossy data compression. With lossless data compression, all information inside the data is preserved but with the cost of very low compression ratio. With lossy data compression, a higher compression ratio is usually obtained but the user needs to accept the loss a certain level of accuracy of the data. For this reason, lossy data compression methods are generally used depending on the nature of the processed data.

Thus, for example, for two-dimensional graphic data, it is known to use a wavelet compression method which belongs to the class of lossy compression methods. This method is one of the most famous compression methods used in graphic processing, (example JPEG2000 for two-dimensional graphic data).

The method is based on the known wavelet transform which, applied to graphic data, converts the pixels forming this data into wavelet coefficients. The distribution of values for the wavelet coefficients is usually centered around zero, with few large coefficients. As all the information are concentrated in a small fraction of the coefficients, wavelet coefficients of the input data can be compressed more easily compared to the original input data.

However, the existing data compression methods are not sufficiently fast in processing of large volumes of data so as the gain of time obtained by using an I/O processing with compressed data may be lost. In other words, for large volumes of data, the computing cost of compression is really expensive, and makes the usage of compressed data during I/O processing no attractive.

The present invention aims to improve the rapidity of data compression so as it can be widely used while I/O processing even with large volumes of data.

SUMMARY OF THE INVENTION

For this purpose, the present invention proposes a method of input data compression performed by at least one core communicating with a central memory, the core being associated to an operating cache memory able to store data items, and comprising a plurality of vector registers able to store data items to be processed, each vector register presenting a predetermined register length, the operating cache memory comprising a plurality of cache lines, each cache line presenting a predetermined cache line length which is a multiple of the register length;

the input data presents a two-dimensional input array formed by a plurality data items stored contiguously in the central memory according to a contiguous direction;

the method comprising a step of two-dimensional wavelet transform implemented using a low band-pass filter vector of dimension N and a high band-pass filter vector of dimension N, said step comprising the following sub-steps:

A) forming from the input array at least one tile comprising a plurality of consecutive data block columns, each data block column being formed by a plurality of lines of consecutive data items according to the contiguous direction, the length of each line being a multiple of the cache line length;

C) for the or each tile, processing each data block column and for each data block column, computing dot products between the low band-pass or high band-pass filter vector and each group of N lines using fused multiply-add instructions for the core.

Provided with these features, the method of data compression according to the invention uses efficiently vector computing units which are provided in most of the modern processors. Particularly, the method according to the invention processes the input data in such a way that fused multiply-add (FMA) instructions on the vector computing units can be used to compute dot products while wavelet transform. Hence, the time of computing of each dot product is sensibly equal to the time of one operation computing by a classical processor. This accelerates considerably the wavelet transform.

In other embodiments, the method may comprise one or several of the following optional features, taken individually or in any technically feasible combination:

- the sub-step C) is performed n times where n is a level of the wavelet transform;
- one tile is formed during the sub-step A), said tile corresponding to said two-dimensional input array;
- the step of two-dimensional wavelet transform further comprises a sub-step D') of transposing the two-dimensional input array, the sub-steps A) and C) being performed before the sub-step D') for the non-transposed input array and then, after the sub-step D') for the transposed input array;

several tiles are formed during the sub-step A), each tile corresponding to a part of said two-dimensional input array which the operating cache memory is able to store entirely, preferably the operating cache memory is able to store entirely each tile and the result of its processing;

the step of two-dimensional wavelet transform further comprises a sub-step D) of transposing of each tile, the sub-step C) being performed before the sub-step D) for each non-transposed tile and then, after the sub-step D) for each transposed tile;

during the sub-step D), each tile is transposed in the operating cache memory;

each data item of two-dimensional input array intended to form the first data item in the corresponding line of the corresponding data block column in the operating cache memory, is stored in the central memory using an address which is a multiple of a predetermined alignment value depending on the cache line length;

the operating cache memory is the level-2 cache of the core or the level-1 cache of the core;

the step of two-dimensional wavelet transform further comprises a sub-step B) of padding at least one tile with a predetermined value so as the number of data items in this tile in each direction presents a number multiple of $2^n$;

comprising a step of quantization of data obtained after the step of two-dimensional wavelet transform;

comprising at least one step of lossless compression of data obtained after the step of quantization.

The invention also relates to a computer program product comprising software instructions which, when executed by a computer system, implement a method defined above.

The invention also relates to a computer system for input data compression for input data compression comprising a central memory and at least one core communicating with the central memory; the core being associated to an operating cache memory able to store data items, and comprising a plurality of vector registers able to store data items to be processed, each vector register presenting a predetermined register length, the operating cache memory comprising a plurality of cache lines, each cache line presenting a predetermined cache line length which is a multiple of the register length; and the computer system being configured to carry out the method according as previously described.

The invention also relates to a method of compressed data extraction data extraction comprising steps configured to decompress input data compressed with the method according as previously described.

BRIEF DESCRIPTION OF THE DRAWINGS

The invention and its advantages will be better understood upon reading the following description, which is given solely by way of non-limiting example and which is made with reference to the appended drawings, in which.

DETAILED DESCRIPTION

Figure 1:
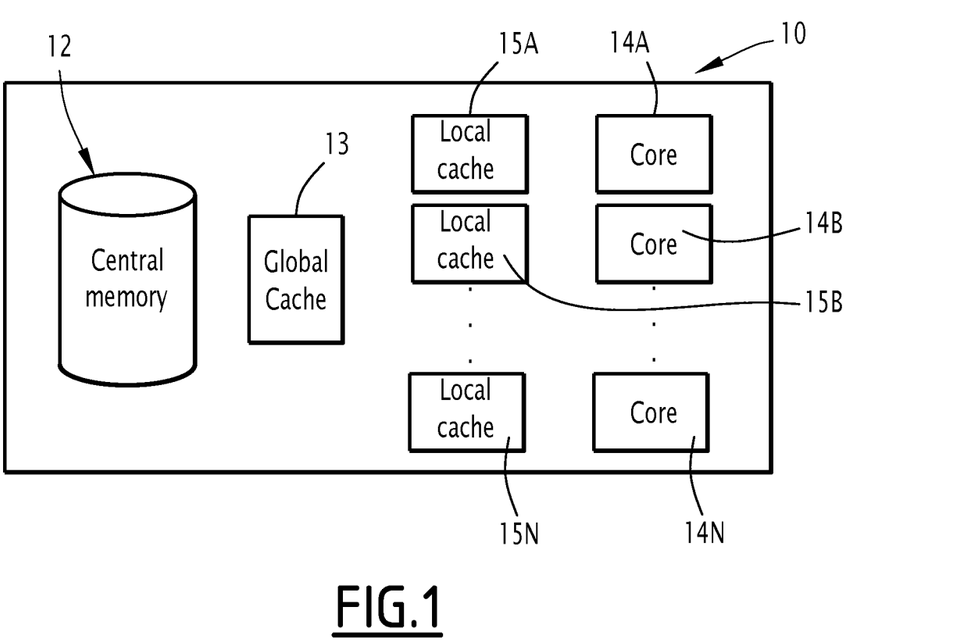
FIG. 1 is a schematic view of a computer system according to the invention.

The computer system 10 of FIG. 1 is for example an HPC system configured to process a large volume of data.

According to the preferred embodiment of the invention, the computer system 10 comprises a central memory 12, a global cache memory 13 and a plurality of cores 14A to 14N associated to local cache memories 15A to 15N.

The central memory 12 is for example main memory of a compute node or an on-chip device memory on a Graphics Processing Unit Card (known as GPU).

In the described embodiment, the input data presents a two-dimensional input array formed by a plurality of data items.

The input data corresponds for example to a high definition image of the ground. In this case, each data item corresponds to a pixel of such an image.

According to another example of the present embodiment, each data item corresponds to any other value which is presented by an appropriate variable type as for example, integer, float, double, etc.

The data items are stored in the central memory 12 in a contiguous manner which corresponds to one of the directions of the input array. Such a direction will be called hereinafter contiguous direction. By "contiguous manner", it should be understood the way of data storage when each data item follows in the memory another data item.

Without reducing the scope of the invention, in the following text, the contiguous direction will be considered as the row direction of the two-dimensional input array.

The global cache 13 is a cache memory shared between all of the cores 14A to 14N. It makes it possible to perform data exchange between the cores 14A to 14N and the central memory 12 according to techniques known per se.

Without reducing the scope of the invention, in the further text, it will be considered that all of the cores 14A to 14N are sensibly identical. Naturally, according to different embodiments of the invention, the system 10 may present a several cores forming a unique processor or a plurality of different cores forming a plurality of processors.

Thus, in the following text, only the core 14A associated to the local cache memory 15A will be explained in more detail.

The core 14A presents a vector processor unit which is able to implement fused multiply-add instructions (known as FMA instructions) to process vector input data. The core 14A is also able to process this data without FMA instructions.

Particularly, as it is known per se, such a core 14A comprises a plurality of vector registers able to store data items to be processed.

The cache memory 15A associated to the core 14A is organized as a hierarchy of cache levels.

According to one example of the present embodiment, the cache memory associated to the core 14A comprises at least two hierarchical levels, called respectively level-1 and level-2.

As it known per se, the level-1 cache memory is usually associated to a unique core. The level-2 cache memory may be shared between two cores. Thus, for example, in reference to FIG. 1, the level-2 cache memory of the local cache memory 15A and the level-2 cache memory of the local cache memory 15A may form a unique level-2 memory which is shared between the cores 14A and 14B.

In the following text, the term "operating cache memory" will designate the level-2 cache. This means that all of the operations described below will be processed in the level-2 cache.

However, it should be noted that these operations can be implemented in the level-1 cache. In such a case, the term "operating cache memory" will designate the level-1 cache.

Moreover, in the case where the core 14A is a part of a GPU card, the term "operating cache memory" designates the scratchpad memory associated to such a core.

The operating cache memory is formed by a plurality of cache lines able to store data items. Each cache line presents a predetermined cache line length. According to a possible example of the present embodiment, the cache line length is equal to 64 bytes.

Moreover, the operating cache memory defines at least an input buffer and an output buffer. The input buffer is able to store data to be processed by the core 14A and the output buffer is able to store data already processed. These buffers have the same size.

The input buffer and the output buffer are allocated in an aligned way in respect with a predetermined alignment value. This means that the first data item of each buffer is stored in the central memory 12 using an address which is a multiple of the predetermined alignment value.

Each vector register presents a predetermined register length so as the cache line length is a multiple of this register length. So, according to a possible example of the present embodiment, the register length is equal to 32 bytes.

Finally, the alignment value explained above is chosen depending on the cache line length. Thus, for example, the alignment value is chosen to be equal to the cache line length.

Figure 2:
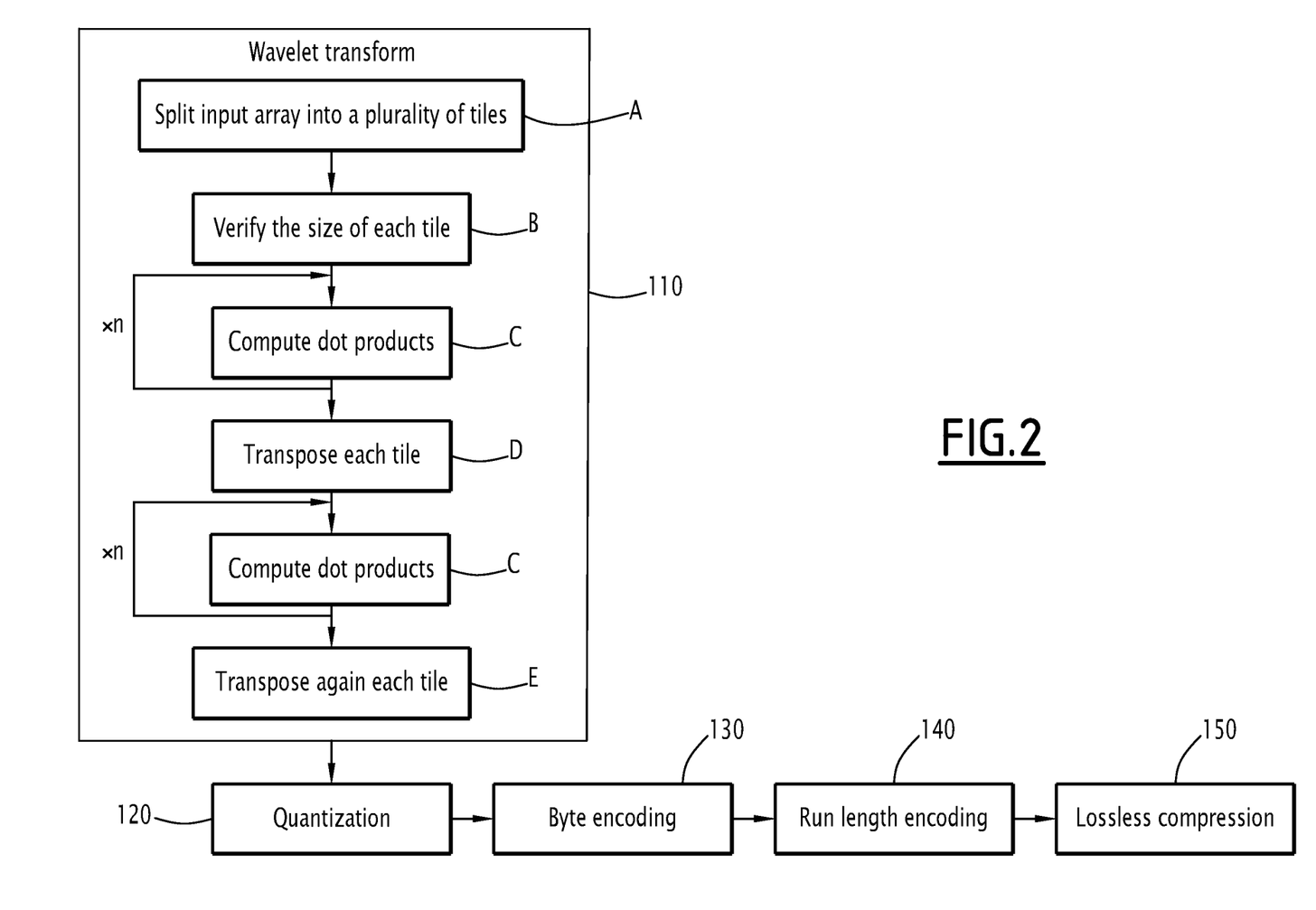
FIG. 2 is a flowchart of a method of input data compression according to the preferred embodiment of the invention, the method being performed by the computer system of FIG. 1.

The method of input data compression performed by the system 10 according to the preferred embodiment of the invention will now be explained in reference to FIG. 2 illustrating a flowchart of the method.

Thus, according to this flowchart, this method comprises an initial step 110 of wavelet transform applied to the input data stored in the central memory 12.

The wavelet transform is performed using a low band-pass filter vector of dimension N and a high band-pass filter vector of the same dimension N. Both vectors are for example defined by a user.

Moreover, the wavelet transform is performed using n levels.

The step 110 is composed by several sub-steps.

During the initial sub-step A), the input array is split into a plurality of tiles. Each tile corresponds thus to a continuous part of the input array.

According to the preferred embodiment of the invention, the input array is split into different tiles so that the operating cache memory is able to store entirely each tile and the results produced after its processing. Particularly, this means that the input array is split in such a manner that the input buffer and the output buffer, which are dedicated to process a tile, can be store entirely in the operating cache memory.

Then, each tile is split into a plurality of data block columns so as each data block column is formed by a plurality of lines of consecutive data items according to the contiguous direction in the input array. According to such design, the first date item of each line inside each data block column is also aligned.

This means that each line of each data block column corresponds to a part of the corresponding original line in the input array.

Moreover, according to the invention, each tile is split so as the length of each line of each data block column is a multiple of the cache line length. This also signifies that the length of each line is a multiple of the register length.

Thus, in the previous example where the register length is equal to 32 bytes and the cache line length is equal to 64 bytes, the length of each line of each data block column may be equal to 256 bytes.

Figure 3:
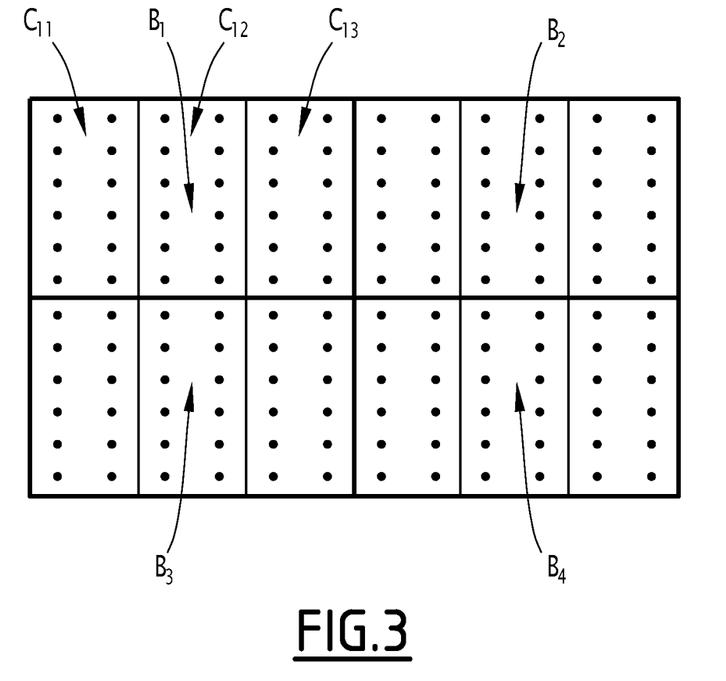
FIGS. 3 and 4 are flowcharts illustrating some of the steps of the method of FIG. 2.

FIG. 3 illustrates an example of such splitting.

Particularly, on this figure, a two-dimensional input array having 144 data items disposed in 12 columns and 12 lines is split into 4 tiles $B_1$ to $B_4$. Each tile $B_1$ to $B_4$ is split into 3 data block columns. On FIG. 3, the data block columns of the tile $B_1$ are designated by $C_{11}$, $C_{12}$ and $C_{13}$.

In this example, each data block column is formed by 6 lines, each line comprising 2 data items.

Of course, other examples of input array splitting are possible. Particularly, it is possible to split the input array into tiles having different sizes, shapes, number of data block columns, etc. Similarly, the data block columns in each tile may have the same size or different sizes.

During the next sub-step B), the size of each title is verified and if the number of data items in a tile in each direction presents a number which is not a multiple of $2^n$ (where n is the level of the wavelet transform), this tile is padded to such a multiple with a predetermined value.

The size of each tile is chosen for performance consideration. The main reasons are: most of the tiles fit the above constraints, so that no pad is needed; the power of 2 is generally also a multiple of cache line size, a multiple of vector register size, so the data fetching is very efficient.

In the case of graphic input array, the predetermined value corresponds for example to the black pixel.

During the next sub-step C), each tile is stored in the input buffer of the operating cache memory associated to one the cores 14A to 14N and is processed by this core.

Particularly, according to the total number of cores and tiles, the processing of different tiles may be parallel and the processing of at least some other tiles may be sequential. It should be also noted that each tile processing can be scheduled dynamically to all available cores.

Additionally, the wavelet transform of a tile comprised in a shared cache memory between two cores may be parallelized depending on the applied filter vector. Thus, for example, the wavelet transform of such a tile may be performed simultaneously by two cores sharing the cache memory: one applying the low band-pass filter vector and the other applying the high band-pass filter vector.

In the following text, processing of only one tile by one core using one of the filter vectors will be explained in more detail. Processing of the other tiles is similar.

Particularly, after said tile is entirely stored in the input buffer of the operating cache memory, the corresponding core processes consecutively each data block column of this tile.

While processing each data block column, the core determines a dot product between the low band-pass or high band-pass filter vector and each group of N lines of this data block column using fused multiply-add instructions (known as FMA instructions in the art). To do this, at least some components of the corresponding filter vector and at least some lines of such a group are stored in the vector registers and the core performs vector computing using these registers.

Thus, the result of each dot product is a line of data items having the same length that the lines of the corresponding data block column. This line is then written to the corresponding line of the output buffer inside the operating cache memory.

Figure 4:
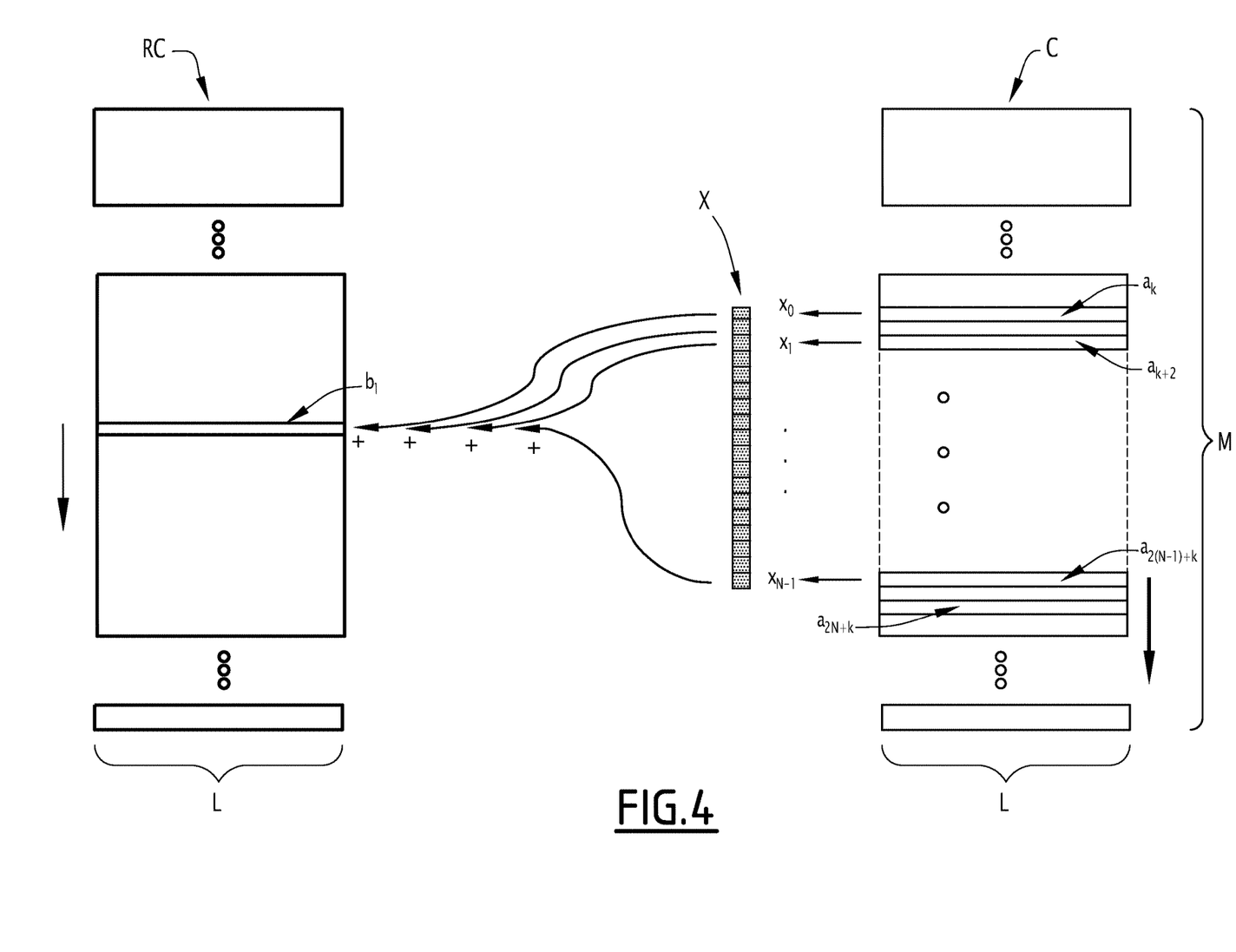

Such operation of the core is illustrated schematically on FIG. 4.

On this figure, C designates a data block column while its processing by the core. The length of each line of this column is designated by L and the length of each data column, i.e. the number of lines in such a column, is designated by M.

A group of N lines to be processed is composed with lines $a_k, \ldots, a_{2i+k}, \ldots, a_{2(N-1)+k}$, where k is an offset which designates the first line of the data block column C to be processed. Each of these lines forms a vector of dimension L. Moreover, X designates the corresponding filter vector composed with the scalar components $x_0$ to $x_{N-1}$. Using these symbols, the calculated dot product may be expressed using the following formula:

$$b_1 = \sum_{i=0}^{N-1} x_i a_{2i+k},$$

where $b_1$ is the result vector which forms a line in the result data block column RC.

To determine the next line of the result data block column RC, the core determines a dot product between the corresponding filter vector and the next group of N lines of the data block column C. The next group of N lines is obtained by excluding line $a_k$ from the previous group and adding line $a_{2N+k}$ which follows the line after line $a_{2(N-1)+k}$.

In the end of this sub-step C), the output buffer of the operating cache memory is filled with a result tile corresponding to coefficients of the wavelet transform of the current level. Then, for a next reiteration of the sub-step C in the same operating cache memory, the output buffer is considered as input buffer and the previous input buffer as output buffer. So, the designation of the buffers interchanges between them.

After, the sub-step C) is reiterated n times. For each following iteration of the sub-step C), the data columns of each tile are divided by 2 and a wavelet transform is performed for each divided part of these columns. This means that in the example of FIG. 4, the first iteration of the sub-step C) is performed for the whole data columns having the length M. During the second iteration of the sub-step C), each data column is divided by two, so as a wavelet transform is performed for each divided part having the length M/2. During the third iteration of the sub-step C), a wavelet transform is performed for each divided part having the length M/4. The other iterations of the sub-step C) are performed similarly.

This means that this sub-step is reiterated for each level of the wavelet transform.

During the next sub-step D), each tile is transposed in the corresponding operating cache memory.

Then, the sub-step C) is performed again n times for each transposed tile. Particularly, like in the previous case, for each following iteration of the sub-step C) after the first iteration, the length of the corresponding data columns is divided by 2.

During the next sub-step E), each tile is transposed again in the corresponding operating cache memory. So, each processed tile corresponds to a two-dimensional array of two-dimensional wavelet transform coefficients of level n.

According to one example of the present embodiment, these coefficients are written to the central memory 12 or kept in the corresponding operating cache memories and then, processed by the others steps of the method.

During the next step 120, a quantization is applied to the data obtained in the previous step.

This quantization is performed for example using a known technique which consists to compress a range of real values to a single integer value.

During the next step 130, a byte encoding is performed on the data obtained during the previous step.

This step is performed using a known technique consisting to code integer values with minimum bytes.

During the next step 140, a run length encoding is performed on the data obtained during the previous step.

According to a known technique, this step consists to encode redundant data as for example X repetitions of the value Y. In this case, this data can be stored as a couple of values X and Y which is preceded by a specific byte for indicate the meaning of this couple.

During the next optional step 150, a lossless compression technique known per se is performed on the data obtained during the previous step. It can be Huffman, or other entropy coding techniques like asymmetric numerical systems.

It should be noted that the steps 130 to 150 are steps of lossless compression. So, these steps can be performed several times in any order. Moreover, at least some of these steps can be replaced by other steps of lossless compression according to techniques known in the art. Finally, according to some examples of the present embodiment, at least some of these steps are performed optionally.

A method of compressed data extraction for data compressed by the method of input data compression according to the invention will now be explained.

The extraction method is similar to the method of input data compression explained above and particularly, comprises the same steps explained above.

Contrary to the method explained above, these steps are performed in the inverse order.

Thus, if during the method of input data compression the step 150 has been performed, the initial step of the extraction method consists to apply the corresponding decoding technique known per se.

Then, a step of run length decoding is performed on the data obtained after the Huffman decoding or on the initial data. This step is thus similar to the step 140 explained above.

Then, a step of byte decoding is performed on the data obtained after the run length decoding. This step is thus similar to the step 130 explained above.

Then, a step of de-quantization is applied on the data obtained after the byte decoding. This step is thus similar to the step 120 explained above.

Finally, an inverse wavelet transform is applied on the data obtained after de-quantization step. This step is identic to the step 110 explained above with the filter vectors chosen in an appropriate way using the same tile and data block column sizes.

One can conceive that the preferred embodiment of the invention presents numerous advantages.

First of all, the method of input data compression according to the preferred embodiment of the invention makes it possible to operate with vectors using fused multiply-add instructions of vector operating cores.

This accelerates considerably computing of dot products during the wavelet transform.

Moreover, all of the operations of the wavelet transform relative to each tile are performed without need to be reloaded from the central memory, all data being comprised in the corresponding cache memory. Hence, only one reading is performed from the central memory, all other operations can be performed directly in the corresponding cache memories. This makes it possible to accelerate the compression method according to the invention up to 10 times.

Further, thanks to the properties of wavelet transform, during the computation of an output line in a result data block column, a large amount of the lines of the corresponding initial data block column is used. As a hardware point of view, a modern processor will fetch all this data only for their first use. According to the invention, data stays on the entire cache lines, so the bandwidth to the central memory is well used. With the careful design of the tile size, and data block column size, there N lines might even stay in vector registers or in the level-1 cache memory, so as a modern processor will automatically keep them inside the vector registers or level-1 cache memory. When computing the next output line, almost all input lines needed from the initial data block column are already present. Such advantage in terms of data reuse and data locality makes the computation of each output line of the result data block column extremely fast.

Further, the data items alignment makes it possible to read fast and efficiently data from the central memory and operating cache memory.

Further, given the size of the tiles, each of them may be padded to a size multiple of $2^n$ only with few predetermined values. This is a particular advantage of the present invention comparing to the classical wavelet transform wherein padding of the initial input data may increase considerably the volume of data to be processed.

Finally, it was observed that splitting the input data on a plurality of tiles does not impact considerably the quality of the wavelet transform near the borders of these tiles.

Figure 5:
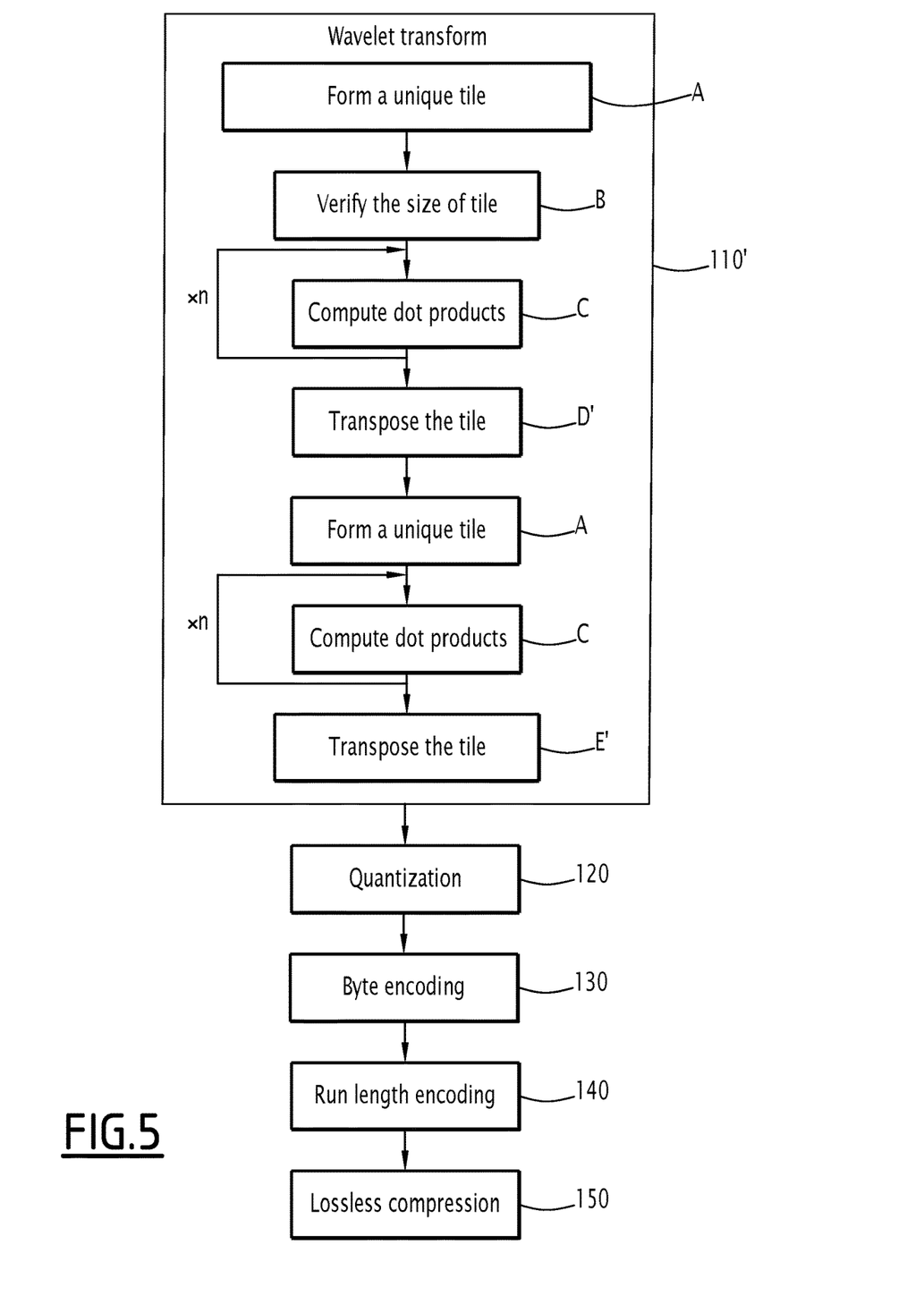
FIG. 5 is a flowchart of a method of input data compression according to another embodiment of the invention.

A method of input data compression according to another embodiment of the invention will now be explained in reference to FIG. 5 illustrating a flowchart of its steps. The method according to this embodiment may also be performed by the computer system 10 explained above.

Additionally, as in the preferred embodiment, the method of input data compression according to this embodiment comprises a quantization step 120, a byte encoding step 130, a run length encoding 140 and eventually a lossless compression step 150. These steps are identical to the corresponding steps explained above and will not be explained in more detail.

The method of input data compression according to the present embodiment comprises also a step of wavelet transform 110' which differs from the step 110 by the features explained below.

Particularly, this step comprises several sub-steps.

During the initial sub-step A), a unique tile is formed from the input array. Thus, this tile corresponds to the entire array and is stored in the central memory 12.

Then, this tile is split into a plurality of data block columns so as each data block column is formed by a plurality of lines of consecutive data items according to the contiguous direction in the input array.

Like in the previous case, the tile is split so as the length of each line of each data block column is a multiple of the cache line length.

During the next sub-step B), the tile is padded with a predetermined value so as the number of data items in this tile in each direction presents a number multiple of $2^n$, where n is the level of the wavelet transform.

This sub-step B) may be also performed before the sub-step A).

Then, during the step C), the data block columns of the tile are processed by one or several cores using fused multiply-add instructions, as explained above. The only difference of this embodiment that the tile may be not entirely comprised in a cache memory. In this case, the data is processed using the central memory and controlling of the cache memory and registers are performed by the corresponding compiler.

As in the previous case, the sub-step C) is reiterated n times by one or several cores. Like in the previous case, for each following iteration of the sub-step C), the length of the corresponding data columns is divided by 2.

Then, during the next step D'), the tile is transposed in the central memory 12.

Then, the step A) is reiterated once and the step C) is reiterated n times by dividing by 2 the length of the corresponding data columns for each following iteration after the first iteration.

Finally, during the next step E'), the tile is transposed again in the central memory 12.

The method of compressed data extraction according to this embodiment of the invention is similar to the extraction method explained above. Thus, as in the previous case, this extraction method performs the same steps as the compression method but in the inverse order.

One can conceive that the invention according to this embodiment presents a certain number of advantages.

First of all, like in the previous case, the step of wavelet transform is considerably accelerated using multiply-add instructions for implement vector computing.

Further, using a unique tile may be advantageous with some computer systems where splitting on numerous tiles cannot be implemented.

Finally, it is clear that according to this embodiment, the wavelet transform is applied homogeneously to the whole input array which avoids any undesired border effect inside the array.

The invention claimed is:

1. A method of input data compression performed by at least one core communicating with a central memory, the core being associated to an operating cache memory able to store data items, and comprising a plurality of vector registers able to store data items to be processed, each vector register presenting a predetermined register length, the operating cache memory comprising a plurality of cache lines, each cache line presenting a predetermined cache line length which is a multiple of the register length;

the input data presents a two-dimensional input array formed by a plurality data items stored contiguously in the central memory according to a contiguous direction;

the method comprising a step of two-dimensional wavelet transform implemented using a low band-pass filter vector of dimension N and a high band-pass filter vector of dimension N, said step comprising the following sub-steps:

A) forming from the input array at least one tile comprising a plurality of consecutive data block columns, each data block column being formed by a plurality of lines of consecutive data items according to the contiguous direction, the length of each line being a multiple of the cache line length;

C) for the or each tile, processing each data block column and for each data block column, computing dot products between the low band-pass or high band-pass filter vector and each group of N lines using fused multiply-add instructions for the core, wherein one tile is formed during the sub-step A), said tile corresponding to said two-dimensional input array, and wherein the step of two-dimensional wavelet transform further comprises a sub-step D') of transposing the two-dimensional input array, the sub-steps A) and C) being performed before the sub-step D') for a non-transposed input array and then, after the sub-step D') for a transposed input array.

2. The method according to claim 1, wherein the sub-step C) is performed n times where n is a level of the wavelet transform.

3. The method according to claim 1, wherein several tiles are formed during the sub-step A), each tile corresponding to a part of said two-dimensional input array which the operating cache memory is able to store entirely, preferably the operating cache memory is able to store entirely each tile and the result of its processing.

4. The method according to claim 3, wherein the step of two-dimensional wavelet transform further comprises a sub-step D) of transposing of each tile, the sub-step C) being performed before the sub-step D) for each non-transposed tile and then, after the sub-step D) for each transposed tile.

5. The method according to claim 4, wherein, during the sub-step D), each tile is transposed in the operating cache memory.

6. The method according to claim 1, wherein each data item of two-dimensional input array intended to form the first data item in the corresponding line of the corresponding data block column in the operating cache memory, is stored in the central memory using an address which is a multiple of a predetermined alignment value depending on the cache line length.

7. The method according to claim 1, wherein the operating cache memory is the level-2 cache of the core or the level-1 cache of the core.

8. The method according to claim 1, wherein the step of two-dimensional wavelet transform further comprises a sub-step B) of padding at least one tile with a predetermined value so as the number of data items in this tile in each direction presents a number multiple of $2^n$.

9. The method according to claim 1, further comprising a step of quantization of data obtained after the step of two-dimensional wavelet transform.

10. The method according to claim 9, further comprising at least one step of lossless compression of data obtained after the step of quantization.

11. The method of compressed data extraction comprising steps configured to decompress input data compressed with the method according to claim 1.

12. A computer program product comprising software instructions which, when executed by a computer system, implement a method of input data compression performed by at least one core communicating with a central memory, the core being associated to an operating cache memory able to store data items, and comprising a plurality of vector registers able to store data items to be processed, each vector register presenting a predetermined register length, the operating cache memory comprising a plurality of cache lines, each cache line presenting a predetermined cache line length which is a multiple of the register length;

the input data presents a two-dimensional input array formed by a plurality data items stored contiguously in the central memory according to a contiguous direction;

the method comprising a step of two-dimensional wavelet transform implemented using a low band-pass filter vector of dimension N and a high band-pass filter vector of dimension N, said step comprising the following sub-steps:

A) forming from the input array at least one tile comprising a plurality of consecutive data block columns, each data block column being formed by a plurality of lines of consecutive data items according to the contiguous direction, the length of each line being a multiple of the cache line length;

C) for the or each tile, processing each data block column and for each data block column, computing dot products between the low band-pass or high band-pass filter vector and each group of N lines using fused multiply-add instructions for the core, wherein one tile is formed during the sub-step A), said tile corresponding to said two-dimensional input array, wherein the step of two-dimensional wavelet transform further comprises a sub-step D') of transposing the two-dimensional input array, the sub-steps A) and C) being performed before the sub-step D') for a non-transposed input array and then, after the sub-step D') for a transposed input array.

13. A computer system for input data compression comprising a central memory and at least one core communicating with the central memory;

the core being associated to an operating cache memory able to store data items, and comprising a plurality of vector registers able to store data items to be processed, each vector register presenting a predetermined register length, the operating cache memory comprising a plurality of cache lines, each cache line presenting a predetermined cache line length which is a multiple of the register length;

the core being configured to carry out a method of input data compression;

the input data presents a two-dimensional input array formed by a plurality data items stored contiguously in the central memory according to a contiguous direction;

the method comprising a step of two-dimensional wavelet transform implemented using a low band-pass filter vector of dimension N and a high band-pass filter vector of dimension N, said step comprising the following sub-steps:

A) forming from the input array at least one tile comprising a plurality of consecutive data block columns, each data block column being formed by a plurality of lines of consecutive data items according to the contiguous direction, the length of each line being a multiple of the cache line length;

C) for the or each tile, processing each data block column and for each data block column, computing dot products between the low band-pass or high band-pass filter vector and each group of N lines using fused multiply-add instructions for the core, wherein one tile is formed during the sub-step A), said tile corresponding to said two-dimensional input array, wherein the step of two-dimensional wavelet transform further comprises a sub-step D') of transposing the two-dimensional input array, the sub-steps A) and C) being performed before the sub-step D') for a non-transposed input array and then, after the sub-step D') for a transposed input array.

* * * * *